United States Patent
Gates

[19]

[11] Patent Number: 6,101,090
[45] Date of Patent: Aug. 8, 2000

[54] ELECTRONIC APPARATUS HAVING AN ENVIRONMENTALLY SEALED EXTERNAL ENCLOSURE

[75] Inventor: William George Gates, Wolverton, United Kingdom

[73] Assignee: Lucent Technologies, Inc., Murray Hill, N.J.

[21] Appl. No.: 09/273,143

[22] Filed: Mar. 19, 1999

[30] Foreign Application Priority Data

Mar. 24, 1998 [EP] European Pat. Off. .............. 98302166

[51] Int. Cl.[7] ..................................................... H02K 7/20
[52] U.S. Cl. ........................... 361/690; 361/694; 361/695; 361/697; 361/704; 361/707; 361/719; 361/720; 174/16.1; 174/16.3; 165/80.3; 165/104.33; 165/185
[58] Field of Search ..................................... 361/690, 694, 361/695–697, 701–704, 720, 721; 174/15.1, 16.1, 16.3; 165/80.3, 185, 104.34

[56] References Cited

U.S. PATENT DOCUMENTS

| 4,997,034 | 3/1991 | Steffen et al. ...................... 165/104.34 |
| 5,608,609 | 3/1997 | Morrell ................................... 361/690 |
| 5,650,912 | 7/1997 | Katsui et al. ............................ 361/697 |
| 5,773,755 | 6/1998 | Iwatare .................................... 361/695 |
| 5,812,373 | 9/1998 | Hwang ..................................... 361/704 |
| 5,825,621 | 10/1998 | Giannatto et al. ........................ 361/701 |

FOREIGN PATENT DOCUMENTS

| 0 100 261 | 7/1983 | European Pat. Off. ......... H05K 7/20 |
| 83401407 | 7/1983 | European Pat. Off. ......... H05K 7/20 |
| 0 639 008 A1 | 7/1994 | European Pat. Off. .......... H04B 1/38 |
| 94111636 | 7/1994 | European Pat. Off. .......... H04B 1/38 |
| PCT/US96/02306 | 2/1996 | WIPO ............................. B22D 18/06 |
| WO 96/26030 | 2/1996 | WIPO ............................. B22D 18/06 |

*Primary Examiner*—Leo P. Picard
*Assistant Examiner*—Boris L. Chervinsky

[57] ABSTRACT

An electronic apparatus is disclosed having components mounted within an environmentally sealed external enclosure. The external enclosure is cast from heat conductive material, and the components are mounted in heat conductive association with one or more walls of the external enclosure. These one or more walls have external pin fins projecting therefrom. The pin fins of the present invention improve cooling compared with conventional fins, which are, in effect, flat strips extending a significant distance along the surface of the external enclosure. Additionally, the external enclosure may be lighter in weight than an external enclosure that has conventional fins.

4 Claims, 2 Drawing Sheets

ELECTRONIC APPARATUS HAVING AN ENVIRONMENTALLY SEALED EXTERNAL ENCLOSURE

CROSS-REFERENCED TO RELATED APPLICATION

This application claims priority of European Patent Application No. 98302166.8, which was filed on Mar. 24, 1998.

FIELD OF THE INVENTION

This invention relates to electronic apparatus having components mounted within an environmentally sealed external enclosure.

BACKGROUND OF THE INVENTION

Much electronic apparatus requires cooling. In many cases this is effected by blowing air through an external enclosure that contains the electronic apparatus via vents in the external enclosure. In some situations, for example when the apparatus is to be used outside, the external enclosure must be environmentally sealed. One example of this is base station equipment for a mobile communications network, where an external enclosure containing a transmitter/receiver, a power amplifier, a processor and other units, is mounted outside e.g. on a pole.

The environmental seal prevents air from being blown through the external enclosure. Conventionally, the environmentally sealed external enclosure may be provided with extended surfaces to increase its surface area thus allowing the external enclosure, and thus its contents, to be cooled by convection.

SUMMARY OF THE INVENTION

The present invention provides an electronic apparatus having components mounted within an environmentally sealed external enclosure. The external enclosure is, for example, cast from heat conductive material. The components are mounted in heat conductive association with one or more walls of the external enclosure. The one or more walls having external pin fins projecting therefrom.

The pin fins of the present invention improve cooling compared with conventional fins, which are, in effect, flat strips extending a significant distance along the surface of the external enclosure. Furthermore, the external enclosure may be lighter in weight than an external enclosure that has conventional fins.

In a preferred form, the external enclosure is contained by a vented case, with the pin fins projecting into air passages between the external enclosure and the case. Additionally, a blower may be provided to force a flow of air across the pin fins. The forced air flow across the pin fins provides a great improvement in cooling. Preferably the blower is a centrifugal fan arranged between the pin fins on a wall of the external enclosure. The centrifugal fan can be placed amongst the pins to draw or blow air in all directions across the pin fins providing an advantage over conventional fins, which only allow the air flow to be in one direction, requiring a fan to be placed beyond the end of the fins. Using pin fins, the fan can be placed without extending the product line to accommodate it. Further, the pin fins do not establish laminar flow, allowing the pin fins to be more closely spaced than conventional fins, which require carefully chosen spacing so that laminar flow does not occur between the fins.

BRIEF DESCRIPTION OF THE DRAWINGS

One embodiment of the invention will now be described, by way of example, with reference to the accompanying drawings, in which.

DETAILED DESCRIPTION

Figure 1:
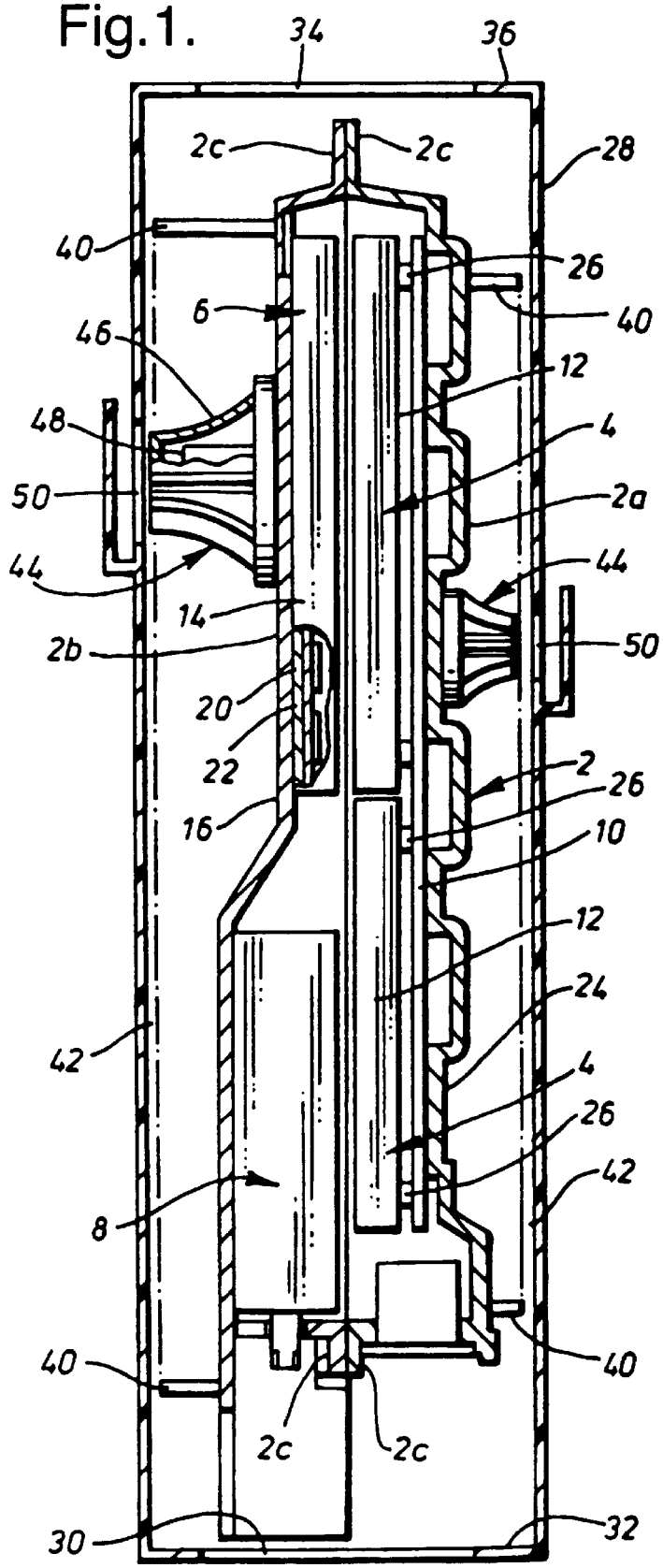
FIG. 1 is a cross section through base station equipment for a mobile telecommunications network.
Figure 2:
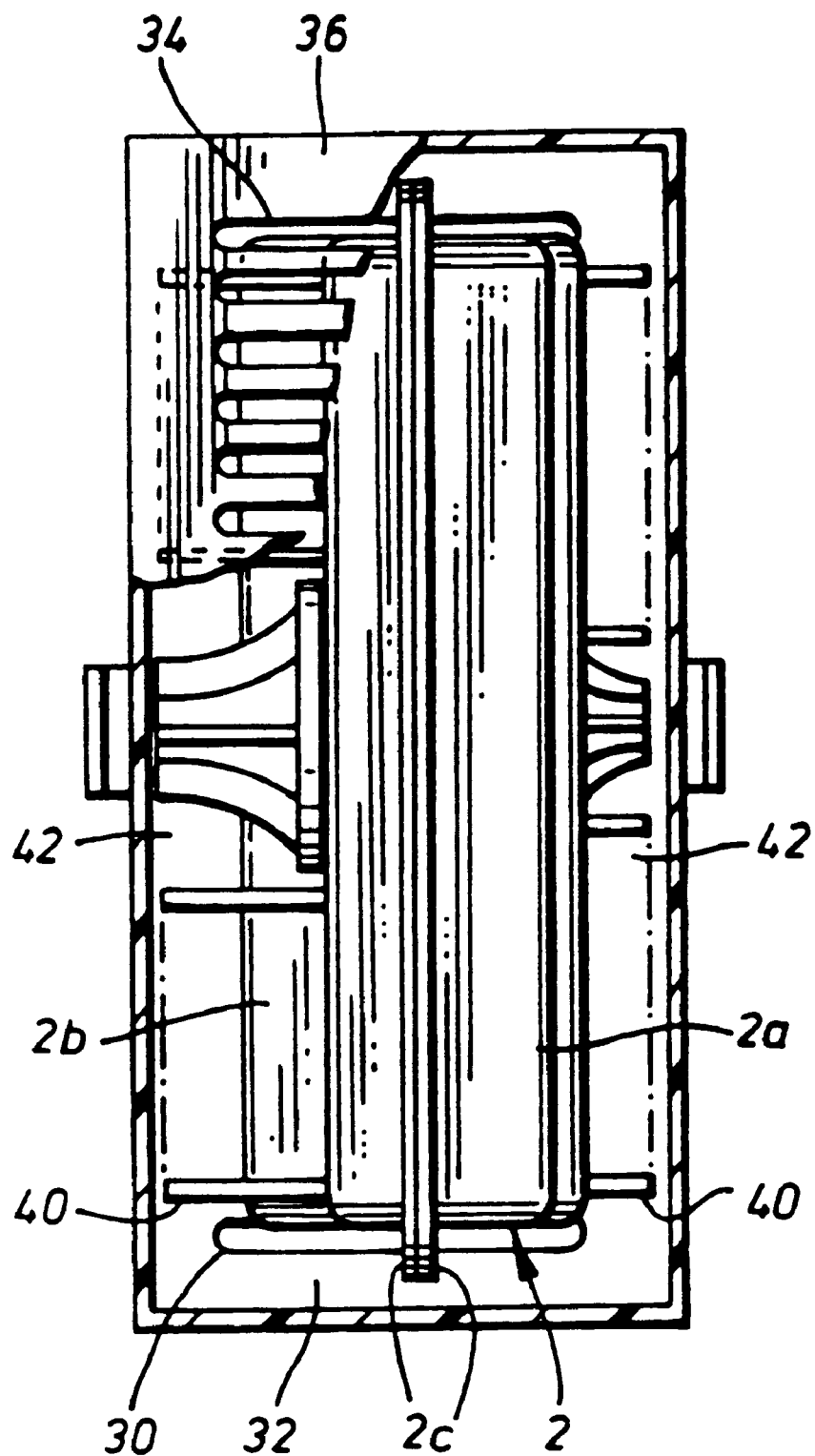
FIG. 2 is a top plan of the equipment of FIG. 1 with part of the top of its outer case broken away.

Referring to FIGS. 1 and 2, base station equipment for a mobile telecommunications network has a thermally conductive external enclosure generally designated by reference numeral 2. The external enclosure 2 is cast, for example, from light metal in two parts 2a and 2b environmentally sealed around a joint between two flanges 2c. The external enclosure contains two transmitter/receiver units 4, two power amplifiers 6, two duplexers 8 and a processor board 10. The transmitter/receiver units 4 and power amplifiers 6 are shielded against radio frequency emissions by aluminum cases 12 and 14. The two power amplifiers 6 are mounted side by side on a wall 16 of the external enclosure 2 so only one is visible in FIG. 1. Similarly the two duplexers 8 are mounted side by side on the wall 16. The power amplifiers and duplexers are thus in thermally conductive contact with the walls 16. A circuit board 20 is mounted in contact with a wall 22 of the case 14 so that components on the board are in conductive association with the wall 16. This allows the heat generated by the component to be conducted to the wall 16 via the circuit board 20 and the wall 22 of the case 14.

The processor board 10 is mounted directly on a wall 24 opposite the wall 16, again in thermally conductive contact. Thus, components on the processor board 10 are also in thermally conductive association with the wall 24. The transmitter/receiver units 4 are mounted on pillars 26 over the processor board 10.

The external enclosure 2 is contained by a ventilated case 28 having vents 30 in its bottom 32 and vents 34 in its top 36.

The walls 16 and 24 have pin fins 40. The pin fins 40 project into air passages 42 between the external enclosure 2 and the case 28. The pin fins ensure that the air flow over them is turbulent, providing a significant improvement over conventional flat extended strip fins where spacing has to be carefully chosen to prevent laminar flow from building up across the space between the them.

Components in the external enclosure are thus cooled by thermal conduction to, and through, the walls 16 and 24 of the external enclosure 2 and by natural convection over the extended strip fins 40.

Cooling is assisted by blowers in the form of centrifugal fans 44 each having an impeller 46 driven by an electric motor 48 (only one motor is shown). The fans are mounted on respective walls 16 and 24 and are surrounded by pin fins. The fans draw air in through apertures 50 and blow it in all directions through the pin fins, which would not be possible with conventional strip fins.

While the invention has been described with reference to a preferred embodiment, it will be understood by those skilled in the art having reference to the specification and drawings that various modifications may be made and various alternatives are possible therein without departing from the spirit and scope of the invention.

What is claimed is:

1. Electronic apparatus having components mounted within an environmentally sealed external enclosure comprising:

at least two walls comprising heat conductive material;

wherein one or more of the components are mounted in heat conductive association with one or more walls of the external enclosure;

pin fins projecting from at least two of the walls;

the external enclosure is contained by a vented case;

the pin fins project into air passages between the external enclosure and the vented case; and a blower arranged between the pin fins on one of the walls of the external enclosure to force a flow of air across the pin fins.

2. Apparatus as claimed in claim 1, wherein the blower is a centrifugal fan arranged between the pin fins on one of the walls of the external enclosure.

3. Electronic apparatus comprising:

an environmentally sealed external enclosure having at least two walls fabricated from heat conductive material;

components mounted within the environmentally sealed external enclosure, wherein one or more of the components are mounted in heat conductive association with the one or more walls of the external enclosure;

pin fins projecting from at least two of the walls;

the external enclosure is contained by a vented case;

the pin fins project into air passages between the external enclosure and the case; and a blower arranged between the pin fins on one of the walls of the external enclosure to force a flow of air across the pin fins.

4. Apparatus as claimed in claim 3, wherein the blower is a centrifugal fan arranged between the pin fins on one of the walls of the external enclosure.

* * * * *